United States Patent [19]
Graff et al.

[11] Patent Number: 6,008,129
[45] Date of Patent: Dec. 28, 1999

[54] PROCESS FOR FORMING A SEMICONDUCTOR DEVICE

[75] Inventors: Wesley Phillip Graff, Austin; Freddie Cumpian, Pflugerville; Douglas Jason Dopp, Austin; William David Darlington, Leander, all of Tex.

[73] Assignee: Motorola, Inc., Schaumburg, Ill.

[21] Appl. No.: 08/919,406

[22] Filed: Aug. 28, 1997

[51] Int. Cl.[6] .................................................. H01L 21/311
[52] U.S. Cl. .......................... 438/700; 438/628; 438/638; 438/704; 438/711
[58] Field of Search .................................... 438/622, 627, 438/628, 629, 637, 638, 639, 640, 643, 644, 675, 688, 695, 696, 700, 704, 706, 708, 709, 711, 714, 725, 734, 740, 747, 749

[56] References Cited

U.S. PATENT DOCUMENTS

| | | | |
|---|---|---|---|
| 4,444,618 | 4/1984 | Saia et al. | 438/712 |
| 5,399,237 | 3/1995 | Keswick et al. | 216/68 |
| 5,476,816 | 12/1995 | Mautz et al. | 438/622 |
| 5,798,303 | 8/1998 | Clampitt | 438/696 |
| 5,798,323 | 8/1998 | Honda et al. | 510/176 |

OTHER PUBLICATIONS

Sadayuki Jimbo et al, "Resist and Sidewall Film Removal after Al Reactive lo$\mu$ Etching (RIE) Employing F+$H_2O$ Downstream Ashing", Jpn. J. Appl. Phys. vol. 32 (1993) Pt. 1, No. GB, pp. 3045–3050.

K. Mocala et al., "Characterization, Properties and Analysis of Via Veils", Proceedings of the 4th Int'l. Symp. on Cleaning Tech. in Semiconductor Dev. Mfg., vol. 10, The Electrochemical Soc., pp. 395–400.

Stanley Wolf Ph.D., "Silicon Processing for the VLSI Era", by Lattice Press 1990, vol. 2 Process Integration, pp. 105–107.

Stanley Wolf Ph.D., "Silicon Processing for trhe VLSI Era", 1986 by Lattice Press, vol. 1, Process Technology, p. 546 and pp. 564–565.

*Primary Examiner*—Charles Bowers
*Assistant Examiner*—Jack Chen
*Attorney, Agent, or Firm*—George R. Meyer

[57] ABSTRACT

A process for forming via openings (24) between two aluminum-containing interconnects (15) which includes removing a veil material (22) formed during etching of an insulating layer (12), where the veil material (22) is then removed by a combination process of a first dry etch followed by an aqueous organic solvent exposure. The first dry etch uses oxygen containing and fluorine-containing gases, and is performed during the resist removal. This combination process effectively removes the veil (22), even for the heaviest of veil formation, without adversely affecting the insulating layer (12) or the underlying interconnect (15) that includes aluminum. The temperature of the aqueous organic solvent may be reduced, decreasing the amount of volatile organic compound emissions from the solvent while maintaining solvent strength.

29 Claims, 2 Drawing Sheets

6,008,129

PROCESS FOR FORMING A SEMICONDUCTOR DEVICE

FIELD OF THE INVENTION

This invention relates in general to processes for forming semiconductor devices, and more particularly, to processes for forming semiconductor devices having via structures.

BACKGROUND OF THE INVENTION

Many semiconductor devices typically require at least two levels of interconnects that typically contain aluminum or an aluminum-containing alloy. During the formation of a via opening, which is a contact opening that is formed between two interconnect levels, a veil material can be formed along the sides of the via opening. More specifically, during the via etch, the oxide or other insulating layer is etched until the aluminum-containing material within the lower interconnect is exposed. This process forms a veil material that typically includes aluminum, the insulating material, and compounds from the photoresist. Removing this veil material has proven to be extremely difficult as the veil needs to be removed without excessively etching the insulating layer or causing adverse reactions with the underlying aluminum-containing layer.

An attempt to address the prior art problem has been to use fluorine and water vapor during ash processing to try to remove the veil. This process does not effectively remove the veil reproduceably for a manufacturing environment. Wet chemical processing has also been used, however, the presence of fluorine-containing solvents are likely to attack the insulating layer too much and any chemicals used to remove aluminum within the veil would attack the aluminum within the interconnect. Use of organic solvents has been commonly used within the semiconductor industry. However, the use of solvents by themselves has proved insufficient as heavily veiled via openings are not adequately cleaned using an organic solvent clean alone.

DETAILED DESCRIPTION

A process for forming via openings between two aluminum-containing interconnects is described. In one embodiment of this process, an insulating layer is etched. As a result of the etching, veil material forms within the opening. This veil material is then removed by a combination process of a first dry etch followed by an aqueous organic solvent exposure. The first dry etch uses oxygen-containing and fluorine-containing gases, and is performed during the resist removal. This combination process effectively removes the veil, even for the heaviest of veil formation, without adversely affecting the insulating layer or the underlying interconnect that includes aluminum. The present invention is better understood with the description of the embodiments that follow.

Figure 1:
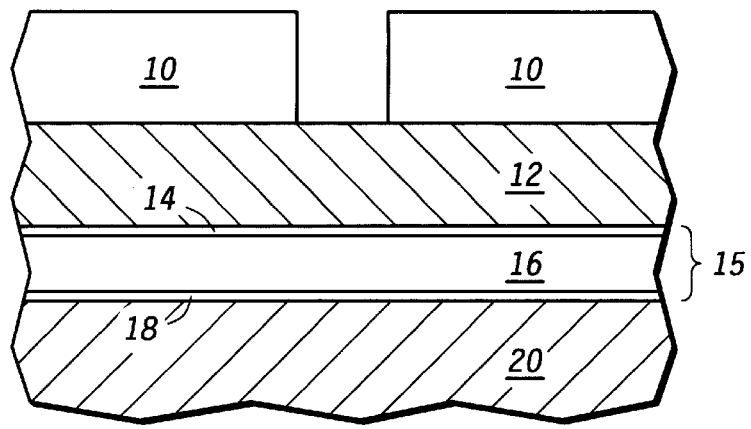
FIG. 1 includes an illustration of a cross-sectional view of a portion of a substrate after forming an opening within a resist layer.

FIG. 1 includes a cross-sectional view of a portion of a substrate prior to performing a via etch. More specifically, the substrate includes a first insulating layer 20, a first interconnecting layer 15 overlying the first insulating layer 20, a second insulating layer 12 overlying the first interconnecting layer 15 and a resist layer 10 with an opening where the via will subsequently be formed. The first and second insulating layers typically include oxide, nitride, or the like and may be either doped or undoped. The first interconnect 15 layer includes an adhesion/barrier film 18, an aluminum-containing film 16, and an anti-reflective coating 14. In one embodiment, the adhesion/barrier film 18 includes titanium and titanium nitride and has a thickness no greater than about 1,000 angstroms. The aluminum-containing film 16 typically has a thickness in a range of approximately 5,000–10,000 angstroms. The anti-reflective coating 14 includes titanium nitride or other nitride films and has a thickness in a range of approximately 200–600 angstroms. In another embodiment, the first interconnecting layer 15 does not require either the adhesion/barrier film 18 or the anti-reflective coating 14. However, those skilled in the art can determine whether their processes require either or both of these films.

Figure 2:
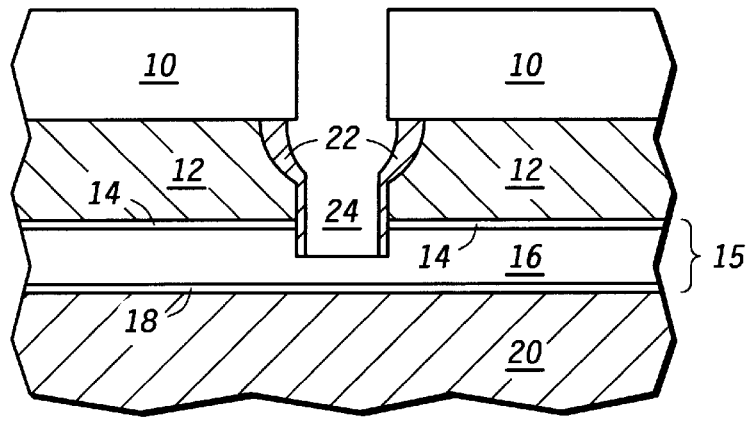
FIG. 2 includes an illustration of a cross-sectional view of the substrate of FIG. 1 after forming a via opening and having the veil material on the sides of the via.

A via opening 24 is formed to expose a portion of the aluminum-containing film 16 as illustrated in FIG. 2. The particular process illustrated in FIG. 2 includes a first step of performing an isotropic etch of the second insulating layer, followed by a second step of performing an anisotropic etch that essentially has vertical or nearly vertical sidewalls to form the via opening as illustrated in FIG. 2. During the process for forming the via opening 24, veil material 22 is formed along the sides of the via opening 24. This veil material 22 is particularly thick along the upper portions of the via opening 24 where the isotropic etching has occurred. The problem exists in that the prior art methods adversely affect the insulating layer 12 or the aluminum-containing film 16 during removal of the veil material 22. The present invention provides a method of removing the veil material 22 without adversely affecting the insulating layer 12 or the aluminum-containing film 16.

Figure 3:
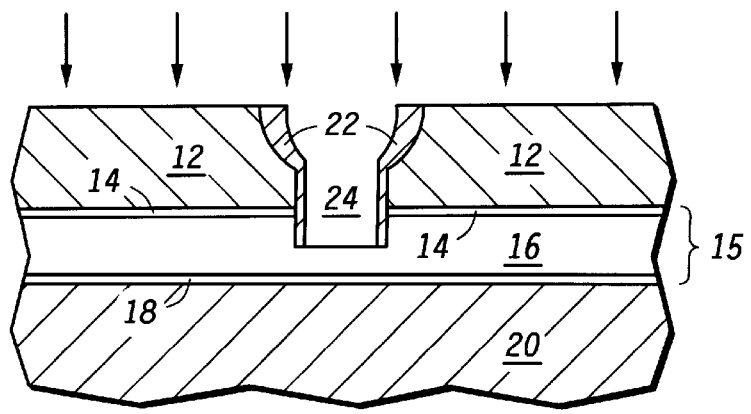
FIG. 3 includes an illustration of a resist removal step that incorporates oxygen and nitrogen trifluoride in accordance with an embodiment of the present invention.

Continuing with FIG. 3, after the isotropic and anisotropic etches, the resist layer is then ashed as shown by the arrows in FIG. 3. This dry etching is performed using a combination of an oxygen-containing and a fluorine-containing species. The oxygen-containing species can be oxygen, ozone, or the like, and the fluorine-containing species can include nitrogen trifluoride ($NF_3$), carbon tetrafluoride ($CF_4$), hexafluoroethane ($C_2F_6$), octofluorocyclobutane ($C_4F_8$), or the like. Additionally, other gases may be used in place of or in conjunction with the fluorine-containing gases. For example, a hydrogen-containing species may be used, such as trifluoromethane or a gas compound that may include molecular hydrogen. This ashing step may be a dry etching process performed using reactive ion etching with a parallel plate etcher. Alternatively, the ashing step may be a dry etch process performing using a remote plasma etcher, referred to as a "line of sight" plasma etcher. Still further, the ashing step may be performed using a downstream plasma etching system.

In one embodiment, a reactive ion etcher can be used with molecular oxygen flowing in a range of approximately 1–5 standard liters per minute. If the fluorine-containing gas is nitrogen trifluoride, the flow rate is usually less than approximately 50 standard cubic centimeters per minute and typically is about 10 standard cubic centimeters per minute. If carbon tetrafluoride is used, the flow rate is usually less than 100 standard cubic centimeters per minute and typically is about 20 standard cubic centimeters per minute. The pressure for the reactive ion etching is typically performed at a pressure in a range of approximately 0.1–2.0 torr using 1,000 watts for a 200 millimeter diameter substrate. The power density is typically 0.02–0.04 watts per square millimeter. In this particular embodiment, the pressure is 0.5 torr and the radio frequency of the power is approximately 13.5 megahertz. Clearly, other operating parameters are possible and these examples are not meant to limit the scope of the present invention.

The oxygen within the plasma ambient attacks organic species within the veil material 22 and the fluorine-containing species typically converts the aluminum to an aluminum fluoride compound which should be more soluble in water than aluminum without the fluorine-containing species.

Figure 4:
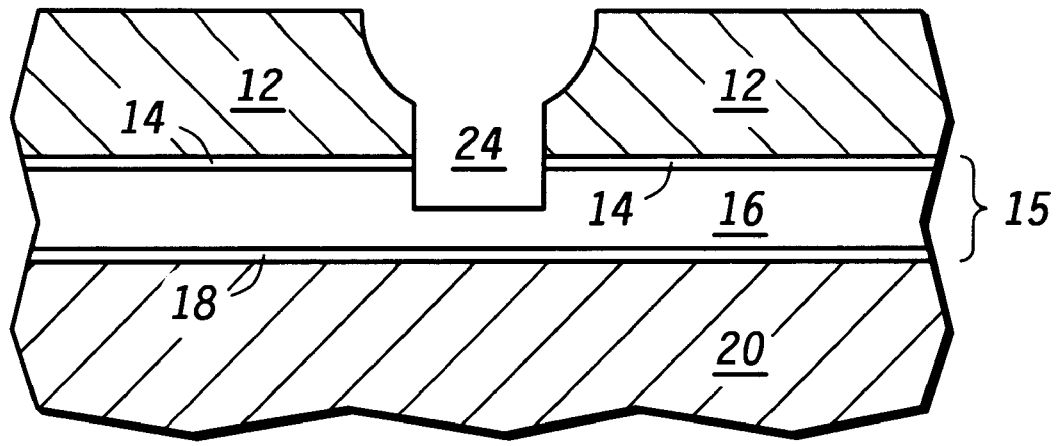
FIG. 4 includes an illustration of a cross-sectional view of the substrate of FIG. 3 after performing an organic solvent clean in accordance with an embodiment of the present invention.

The substrate is then exposed to an aqueous organic solvent. This exposure may occur using a bath or a spray solvent tool. The organic solvent should be either polar or include a reducing agent. Typical compounds for the organic solvent can include amines, keytones, or alcohols. In an example of amines, the amine typically is hydroxyl amine ($NH_2OH$) or an aliphatic, alkyl, or aromatic amine. Other than hydroxyl amine, amines have a general formula of R1R2NH. Typically, R1 includes an aliphatic group, an alkyl group, or an aromatic group, and R2 includes hydrogen, an aliphatic group, an alkyl group, or an aromatic group. Normally, each of the aliphatic, alkyl, and aromatic groups has no more than ten carbon atoms. Examples include ethanolamine, ethyleneamine, and phenylamine. Examples of the ketones include acetone, methyl ethyl ketone, or the like. Alcohols can include methanol, ethanol, propanol, or any other liquid alcohols. In general, the number of carbon atoms for these various amines, ketones and alcohols should be limited so that the solvent is not too viscous and remains in solution. Therefore, these solvents typically include anywhere from one to ten carbon atoms. The presence of both the organic compound and water within the solvent helps to remove both the organic matter and dissolve some of the aluminum fluoride compounds into the solution. At this point, most if not all of the veil material 22, should be removed as illustrated in FIG. 4.

In one embodiment, the spray solvent tool is utilized with the aqueous organic solution where approximately one to two gallons per minute of solution are introduced while the substrate is spinning at approximately 100 revolutions per minute or less. The temperature of the organic solvent can be lowered compared to the prior art. Typically, in the prior art the organic solvent can be used in a range of approximately 75–85° C. In this embodiment of the present invention including the plasma etching step, the temperature of the organic solvent exposure may be reduced to 25° C. or even lower. Typically the aqueous organic solvent is at a temperature in a range of approximately 50° C.–70° C.

After the aqueous organic solvent exposure, the substrate then can receive an optional amine-removal step. This amine-removal step can use an alcohol or an amide. The alcohol has a general formula of ROH, and the amide has a general formula of $R_1CONH_2$. R and $R_1$ typically have ten carbon atoms or less. Typically, this exposure is done closer to room temperature and generally does not exceed 40° C.

Following that, the substrate can receive yet an additional optional rinse, this time using de-ionized water after any amines have been removed.

Figure 5:
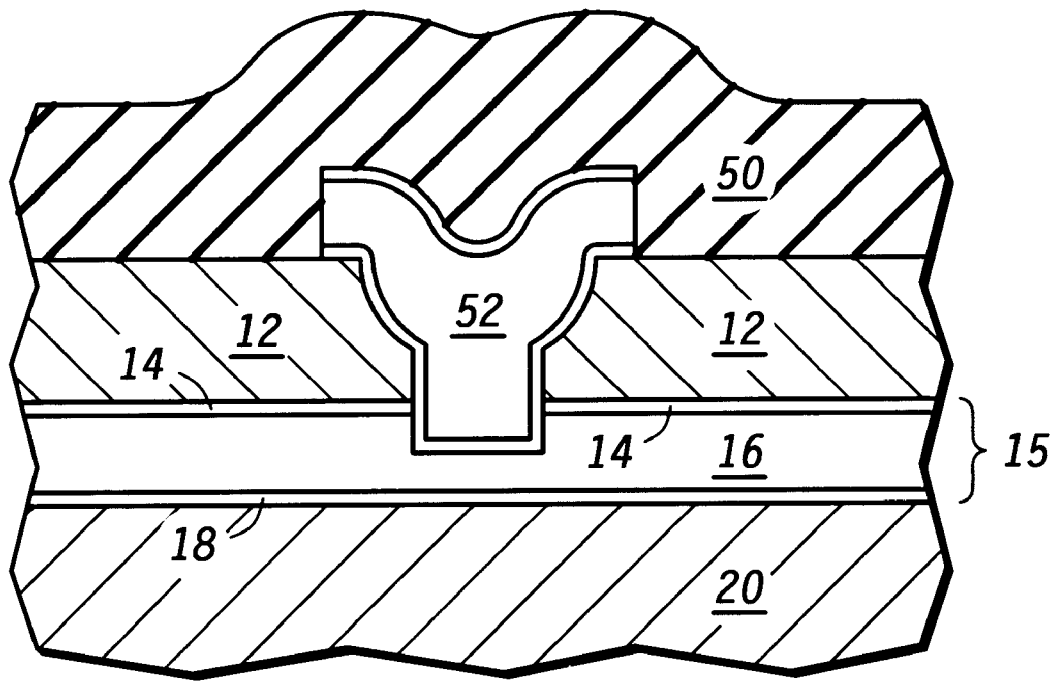
FIG. 5 includes an illustration of a cross-sectional view of the substrate of FIG. 4 after forming a substantially completed device.

Further processing is performed to complete a substantially completed semiconductor device as illustrated in FIG. 5. The substrate is further processed to include a second interconnect layer 52, and a passivation layer 50 formed over the uppermost level of interconnects. The second interconnect layer 52 is similar to that shown for the first interconnecting layer 15. The passivation layer 50 may include one or more films and is generally used for mobile ion gettering, scratch protection, and moisture protection for the underlying components that reside in or on the substrate.

Embodiments of the present invention include various benefits consistent with the method and chemicals used, and the size and material of the veil, and the shape of the via formed. More particularly, the processes used in these embodiments allow a via veil material to be removed without adversely attacking the insulating layer or aluminum-containing film over which the via is formed. The plasma treatment including oxygen-containing and fluorine-containing gases allows the via material to be more effectively removed by the aqueous organic solvent exposure. Because of this increased effectiveness, the temperature of the aqueous organic solvent may be reduced. By reducing the temperature, the solvent is less likely to attack fittings or other portions of the apparatus in which the solvent is contained. Further, the lower temperature reduces the amount of water being driven off from the aqueous solution and therefore, maintains solution strength. Additionally, the lower temperature should reduce the amount of volatile organic compound emissions from the solvent. This can be important as organic species are typically difficult to completely remove from a scrubber system.

The embodiments also allow the rinse time to be decreased while the strength of the chemicals is maintained over longer periods of time. This decreased rinse time increases throughput and can reduce the usage of chemicals. Still another benefit of the embodiments of the present invention is that they can be integrated into an existing process flow without adding any additional processing steps or by the integration of marginal or complex processing steps. By using the embodiments of the present invention, the via veil material can easily be removed and helped to increase the yield of the product that would otherwise be scrapped due to problems associated with the veil removal processing steps.

We claim:

1. A process for forming a semiconductor device comprising the steps of:
   providing a substrate having an aluminum-containing film and an insulating layer over the aluminum-containing film;
   forming a patterned resist layer over the insulating layer;
   etching through the insulating layer to expose the aluminum-containing film that forms a via opening and a veil within the via opening;
   removing the patterned resist layer with a dry etch process using an oxygen-containing gas and a fluorine-containing gas, wherein the veil is exposed to the oxygen-containing and fluorine-containing gases; and
   rinsing the via opening with an organic solvent after the step of removing.

2. The process of claim 1, wherein the organic solvent is an aqueous organic solvent.

3. The process of claim 1, wherein the organic solvent includes a compound selected from a group consisting of a polar organic species and a reducing agent.

4. The process of claim 1, wherein the organic solvent includes a compound from a group consisting of amines, ketones, and alcohols, wherein each of the amines, ketones, and alcohols has no more than ten carbon atoms.

5. The process of claim 4, wherein the organic solvent includes a compound selected from a group consisting of hydroxyl amine and $R_1R_2NH$, where:

$R_1$ is selected from a group consisting of an aliphatic group, an alkyl group, and an aromatic group, wherein each of the aliphatic, alkyl, and aromatic groups has no more than ten carbon atoms; and $R_2$ is selected from a group consisting of hydrogen, an aliphatic group, an alkyl group, and an aromatic group, wherein each of the aliphatic, alkyl, and aromatic groups has no more than ten carbon atoms.

6. The process of claim 1, the step of rinsing is performed at a temperature of at least approximately 25° C.

7. The process of claim 6, the step of rinsing is performed at a temperature in a range of approximately 50° C. to 70° C.

8. The process of claim 1, wherein the step of rinsing comprises a step of dispensing the organic solvent with a spray solvent tool.

9. The process of claim 8, wherein the step of dispensing the organic solvent is performed at a flow rate in a range of approximately 1 gallon per minute to 2 gallons per minute.

10. The process of claim 8, wherein during the step of dispensing, the substrate is rotated at a rotational speed no greater than approximately 100 revolutions per minute.

11. The process of claim 1, further comprising a step of rinsing the via opening with a compound selected from a group consisting of an alcohol and an amide, wherein this step is performed after the step of rinsing the via opening with the organic solvent.

12. The process of claim 11, further comprising a step of rinsing the via opening with deionized water after the step of rinsing the via opening with the organic solvent.

13. The process of claim 1, further comprising a step of rinsing the via opening with deionized water after the step of rinsing.

14. The process of claim 1, further comprising steps of:
forming an interconnect after the step of rinsing; and
forming a passivation layer over the insulating layer and the interconnect.

15. The process of claim 1, wherein the fluorine-containing gas is $NF_3$ and the oxygen-containing gas is $O_2$, and wherein the dry etch process comprises steps of:

flowing $O_2$ at a first flow rate; and flowing $NF_3$ at a second flow rate, wherein a ratio of the first flow rate to the second flow rate is at least approximately 20:1.

16. The process of claim 1, wherein the fluorine-containing gas is $CF_4$ and the oxygen-containing gas is $O_2$, and wherein the step of removing comprises the steps of:

flowing $O_2$ at a first flow rate; and flowing $CF_4$ at a second flow rate, wherein a ratio of the first flow rate to the second flow rate is at least approximately 10:1.

17. The process of claim 1, wherein the fluorine-containing gas is selected from a group consisting of $NF_3$, $CF_4$, $SF_6$, $C_2F_6$, and $C_4F_8$.

18. The process of claim 1, wherein the step of removing comprises a step of flowing $O_2$ at a rate in a range of approximately 1 standard liter per minute to 5 standard liters per minute.

19. The process of claim 1, wherein the step of removing is performed at a power density in a range of approximately 0.02 to 0.04 watts per square millimeter and a pressure in a range of approximately 0.10 to 2.0 torr.

20. The process of claim 1, wherein the oxygen-containing gas is selected from a group consisting of oxygen and ozone.

21. The process of claim 20, wherein the oxygen-containing gas is selected from a group consisting of molecular oxygen and ozone.

22. The process of claim 21, wherein all of the oxygen-containing gas only includes oxygen-containing molecules selected from a group consisting of molecular oxygen and ozone.

23. The process of claim 1, wherein the oxygen-containing gas is selected from a group consisting of molecular oxygen and ozone.

24. The process of claim 22, wherein all of the oxygen-containing gas only includes oxygen-containing molecules selected from a group consisting of molecular oxygen and ozone.

25. A process for forming a semiconductor device comprising the steps of:

providing a substrate having a first oxide layer;

depositing a barrier film over the first oxide layer;

depositing an aluminum-containing film over the barrier film;

depositing an anti-reflective coating over the aluminum-containing film;

forming a second oxide layer over the anti-reflective coating;

forming a resist layer over the second oxide layer;

patterning the resist layer;

etching through the second oxide layer into the aluminum-containing film to form a via opening;

removing the resist layer using an oxygen-containing gas and a fluorine-containing gas;

rinsing the via opening with an aqueous organic solvent;

rinsing the via opening with an alcohol after the step of rinsing the via opening with an aqueous organic solvent;

rinsing the via opening with water after the step of rinsing the via opening with an alcohol;

filling the via opening with at least one conductive material; and forming a passivation layer over the second oxide layer and the at least one conductive material.

26. The process of claim 25, wherein the aqueous organic solvent includes a compound selected from a group consisting of amines, ketones, and alcohols, wherein each of the amines, ketones, and alcohols have no more than ten carbon atoms.

27. The process of claim 25, the step of rinsing the via with the aqueous organic solvent is performed at a temperature of at least approximately 25° C.

28. The process of claim 25, wherein the fluorine-containing gas is $NF_3$ and the oxygen-containing gas is $O_2$, and wherein removing the resist layer comprises steps of:

flowing $O_2$ at a first flow rate; and flowing $NF_3$ at a second flow rate, wherein a ratio of the first flow rate to the second flow rate is at least approximately 20:1.

29. The process of claim 21, wherein the fluorine-containing gas is $CF_4$ and the oxygen-containing gas is $O_2$, and wherein the step of removing comprises the steps of:

flowing $O_2$ at a first flow rate; and flowing $CF_4$ at a second flow rate, wherein a ratio of the first flow rate to the second flow rate is at least approximately 10:1.

* * * * *